(12) United States Patent
Motika et al.

(10) Patent No.: US 6,662,324 B1
(45) Date of Patent: Dec. 9, 2003

(54) GLOBAL TRANSITION SCAN BASED AC METHOD

(75) Inventors: Franco Motika, Hopewell Junction, NY (US); Richard F. Rizzolo, Red Hook, NY (US); Peilin Song, Wappingers Falls, NY (US); William V. Huott, Holmes, NY (US); Ulrich Baur, Weil Im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 563 days.

(21) Appl. No.: 09/642,371

(22) Filed: Aug. 21, 2000

Related U.S. Application Data

(63) Continuation-in-part of application No. 09/473,811, filed on Dec. 28, 1999, now Pat. No. 6,453,436.

(51) Int. Cl.[7] .............................................. G01R 31/28
(52) U.S. Cl. ...................... 714/726; 714/727; 714/729
(58) Field of Search ............................... 714/727, 731, 714/732, 733, 726, 729; 713/500

(56) References Cited

U.S. PATENT DOCUMENTS 5,602,855 A * 2/1997 Whetsel, Jr. ................ 714/727
5,640,402 A * 6/1997 Motika et al. ............... 714/731
6,314,539 B1 * 11/2001 Jacobson et al. ............ 714/727
6,327,685 B1 * 12/2001 Koprowski et al. .......... 714/733
6,516,432 B1 * 2/2003 Motika et al. ............... 714/732
6,539,491 B1 * 3/2003 Skergan et al. .............. 713/500

* cited by examiner

*Primary Examiner*—David Ton
(74) *Attorney, Agent, or Firm*—Lynn L. Augspurger

(57) ABSTRACT

The present invention, enables complementing the state of either the master (L1) or slave latch (L2) in the shift register latches (SRLs) without changing the state of the other. When this is done after properly loading the LSSD scan chain using a normal scan chain sequence, the next system clock sequence can be used to launch a desired transition from each SRL in the scan chain. The actual mechanism for complementing the state of latches in LSSD scan chains can vary depending on which one of the L1 or L2 latch is being complemented; details of the actual scan chain and Shift Register Latch (SRL) design; and the semiconductor chip circuit technology. The complementing function can be provided as an integral part of the SRL design with minimal impact to system path and performance. An alternate complementing method would be to use a self complementing latch function. In this design, the latch to be complemented does not require an additional input containing the complement value, but rather uses its current state as reference and switches to the opposite state. To accomplish this, a complement signal similar to a latch reset (i.e., reset-to-complement) can be used.

15 Claims, 6 Drawing Sheets

GLOBAL TRANSITION SCAN BASED AC METHOD

RELATED APPLICATIONS

This application is a continuation-in-part of U.S. patent application, Ser. No. 09/473,811 filed on Dec. 28, 1999 and entitled "Method and Apparatus for Improving Transition Fault Testability of Semiconductor Chips", now U.S. Pat. No. 6,453,436.

FIELD OF THE INVENTION

The present invention relates to testing of complex combinatorial and sequential logic circuits embodied in large scale integration (LSI) and very large scale integration (VLSI) circuit devices.

BACKGROUND OF THE INVENTION

A fault occurring anywhere in such a LSI or VLSI circuit device can have its effect propagated through a number of feedback loops including storage or memory elements in the sequential logic before reaching a testable output of the device. Level sensitive scan design (LSSD) rules were devised to eliminate the complications in testing caused by this propagation through feedback loops. As described by E. B. Eichelberger and T. W. Williams in an article entitled "A Logic Design Structure for LSI Testablility" on pages 462–468 of the Proceedings of the 14th Design Automation conf., LSSD rules impose a clocked structure on logic circuit memory elements such as latches and registers and require these memory elements be tied together to form a shift register scan path so that they are accessible for use as test input and output points. Therefore, test input signals can be introduced or test results observed wherever one of the memory elements occurs in the logic circuit. Being able to enter the logic circuit at any memory element for introducing test signals or observing test results, allows the combinational and sequential logic to be treated as much simpler combinational logic for testing purposes thus considerably simplifying test generation and analysis. Patents describing LSSD techniques include U.S. Pat. No. 3,783,254; U.S. Pat. No. 3,784,907; U.S. Pat. No. 3,961,252 and U.S. Pat. No. 4,513,418. The subject matter of these patents and the above described Eichelberger and Williams article are hereby included by reference.

As shown in FIG. 1, in accordance with LSSD rules, shift register latches (SRL's) 100 on a semiconductor chip 102 are coupled together to form a shift register LSSD scan latch chain 104 to facilitate testing of combinational logic blocks 106, 108 and 110 interconnected by the SRLs 100 of the scan latch chain 104. While a single scan latch chain is shown here, it should be understood that what follows applies equally as well to latches arranged in multiple scan chains on the chip.

Data is inputted to the combinational logic blocks 106, 108 and 110 and the SRLs 100 in a parallel through primary inputs (PIs) 112 of the chip 102. Data is outputted from the combinational logic blocks 106, 108 and 110 and the SRLs 100 in parallel through the primary outputs (POs) vectors 114 of the chip 102. During testing, the scan chain latch circuits 104 may also be loaded serially. Serial input (SRI) 116 provides a serial input to the scan chain latch circuits 104. Similarly, serial output (SRO) 118 provides an output from scan chain latch circuits 104. Scanning inputs into the serial input SR 116 and out serial input 118 enables testing the SRLs 104 independently of the combinational logic 106, 108 and 110. It also allows each of the individual SRLs to bemused as a pseudo-primary input or a pseudo-primary output for a combinational logic block 106, 108 or 110. The logic circuits in each of the logic blocks to be tested separately of circuits in other of the logic blocks.

As shown in FIG. 2, each of the SRLs 100a to n of the LSSD scan chain 104 is actually a pair of bi-stable latches, a master latch L1 and a slave latch L2. The scan chain 104 serial input 116 is provided to SRL 100a and a serial output 118 is taken from SRL 100n. FIG. 2 shows an AND circuit or gate 202 representing a portion of the combinational logic to be tested. This AND circuit has a first input 204 connected to the output of SRL 100b, and a second input 206 connected to the output of SRL 100c. A known problem with testing using the LSSD scan chain 104 is the inability to AC test certain logic state transitions at the inputs of certain logic circuits such as AND gate 202. As shown, adjacent latches, such as 100b and 100c, feed both inputs 204 and 206 of the AND gate 202. AC coverage is always lower than DC coverage because AC tests require an initial and final state in order to define a transition. A major factor limiting AC test coverage and causing it to be much lower than DC coverage is that the required latch settings to cause a transition often conflict with the latch settings to propagate that transition. As an example, to test the illustrated 2-way AND circuit 202 for slow-to-rise faults, at least one input must have a 0→1 transition while the other input is held at 1 or also transitions from 0 to 1. If both inputs to the AND circuit are driven by SRLs adjacent in the scan chain, those test patterns are not possible. In both cases, the 0→1 transition on one input will cause the final state of the other input to be 0, thus blocking the transition from propagating to an observable point. This invention solves that problem and makes the propagation requirement independent of the transition requirement. In effect, a transition fault becomes just as testable as a DC stuck fault in the same location. For example, in order to test the slow-to-rise fault (0 to 1) of AND gate 202, at least one input 204 requires a 0 to 1 logic transition while input 206 requires a similar logic transition or initial and final logic states of 1. As shown by the logic 1 and 0 states of latches 208b and 210b respectively, and the 0 and 1 logic states of the latches 208c and 210c, the necessary states cannot be provided to the second input 206 because slave latch 210b and master latch 208c are directly connected and have the same 0 logic value. This latch adjacency problem can dramatically reduce the delay fault shipped product quality level (SPQL).

One suggestion for solving the latch adjacency problem is to use "dummy" SRLs or "scan-only" latches in between every pair of SRLs in the scan chain. This method uses more area because the dummy latches are larger than the integrated SRL complementing function. In addition, both A and B clocks must be routed to every dummy SRL. Because the number of loads increase on the A and B clocks, re-powering on those clocks generally needs to be increased.

Another major drawback of LSSD test methodology is encountered when the LSSD scan chain circuit 104 is not functioning properly and access to the internal logic of the circuit is greatly reduced. This is often the case early in the technology or product introduction cycle when the yields are relatively low or even zero. In these situations, the rapid determination of the fault's root cause is critical, but not easily diagnosed. For example, when there is a stuck-at logic 0 fault, a serial output "0"s will come out of the scan chain 104 on output 118 after a certain number of clock cycles, no matter if a serial input on input 116 of mixed logic "0"s or "1"s is scanned in. From this result, it can be determined that there is a stuck-at 1 fault in the scan chain 104, but the exact SRL 100 with the fault condition cannot be located of even isolated. While several techniques have been developed in the past to diagnose this type of failure, these techniques have produced limited success.

In addition, several scan diagnostic approaches that have been proposed. Most of these test software fail data analysis approaches are based on cause-effect algorithms. In many instances, multiple test passes are required for a successful diagnostic call, while in many other cases, these approaches fail or are not very effective. Such software solutions for diagnosing the broken scan chain need more storage and simulation time. If the logic between the SRLs have faults, their diagnostic resolution is very poor. Other hardware solutions either require a large hardware overhead or offer no improvement on transition fault coverage.

BRIEF DESCRIPTION OF THE INVENTION

The present invention, enables complementing the state of either the master (L1) or slave latch (L2) in the shift register latches (SRLs) without changing the state of the other. When this is done after properly loading the LSSD scan chain using a normal scan chain sequence, the next system clock sequence can be used to launch a desired transition from each SRL in the scan chain. The actual mechanism for complementing the state of latches in LSSD scan chains can vary depending on which one of the L1 or L2 latch is being complemented; details of the actual Shift Register Latch (SRL) design; and the semiconductor chip circuit technology. The complementing function can be provided as an integral part of the SRL design with minimal impact to system path and performance. An alternate complementing method would be to use a self complementing latch function. In this design, the latch to be complemented does not require an additional input containing the complement value, but rather uses its current state as reference and switches to the opposite state. To accomplish this, a complement signal similar to a latch reset (i.e., reset-to-complement) can be used.

Therefore, it is an object of the present invention to provide an improved circuits for use in LSSD testing.

It is another object of the invention to provide a shift register latch which will overcome the latch adjacency problem.

A further object of the present invention is to provide improved LSSD testing methods and apparatus.

A still further object of the invention is to provide a SRL in which the state of one of the latches can be complemented without affecting the state of the other of the latches.

A still further object of the invention is to provide improved stuck-at fault scan chain diagnosis.

BRIEF DESCRIPTION OF THE DRAWINGS

These and other objects of the invention are best understood by reading the following description of various embodiments of the invention while making reference to the accompanying figures of which.

DETAILED DESCRIPTION OF THE EMBODIMENTS

Figure 1:
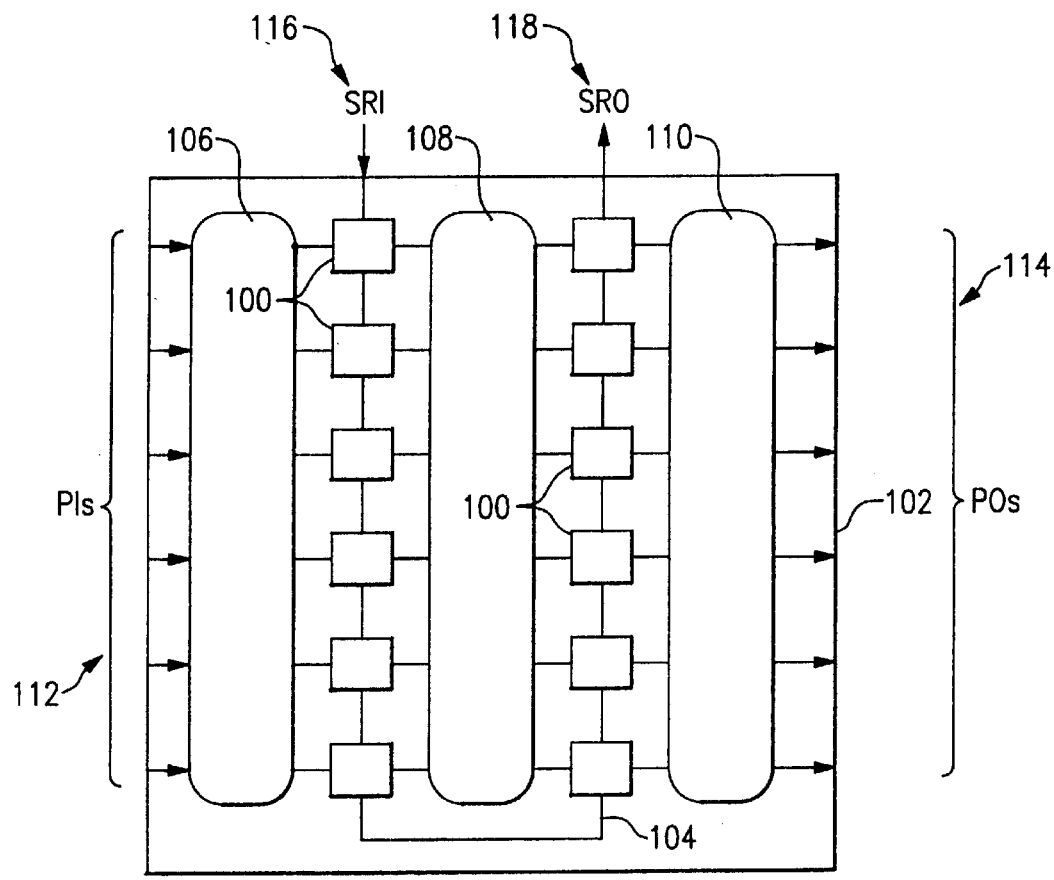
FIG. 1 is a schematic diagram of a VLSI semiconductor chip with SRLs arranged in an LSSD chain.

Reference will now be made to embodiments of the invention shown in the accompanying drawings. Where possible, the same reference numerals are used throughout the drawings to refer to the same or like parts.

Figure 2:
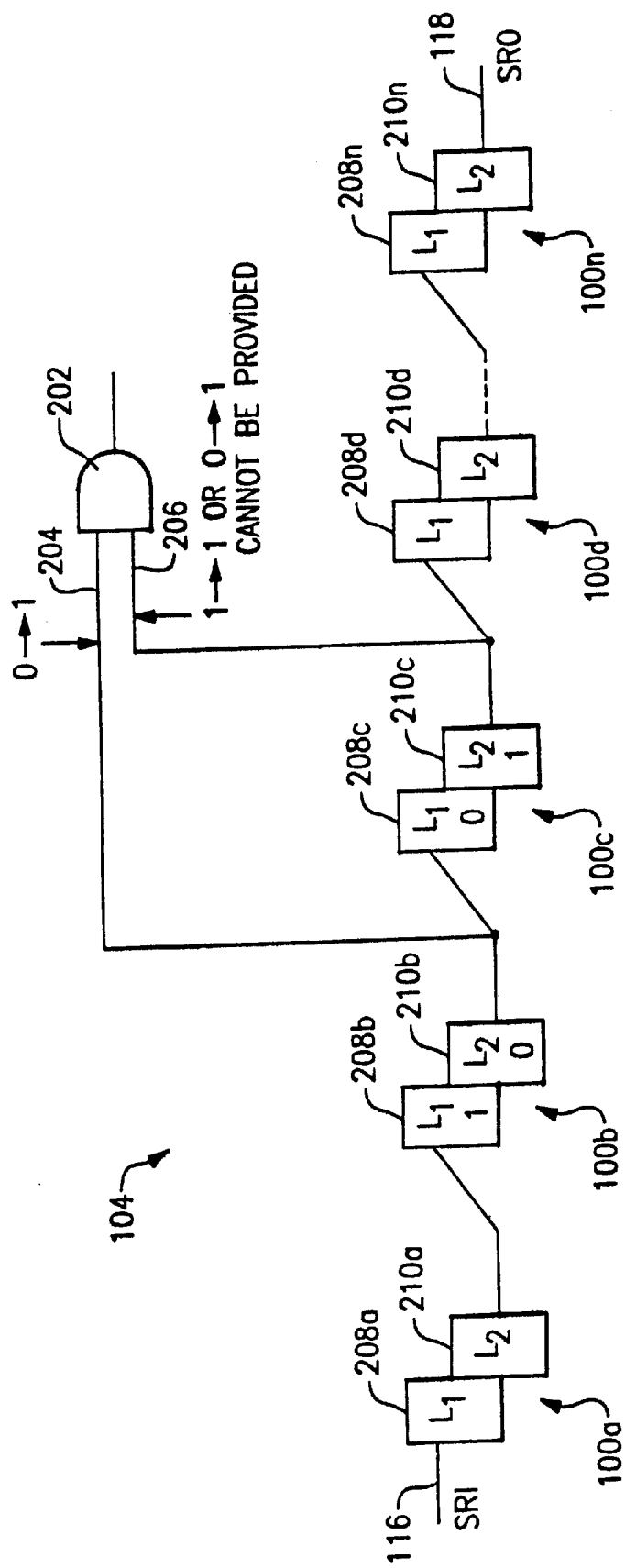
FIG. 2 is a schematic of an LSSD chain showing an example of the latch adjacency problem.
Figure 3:
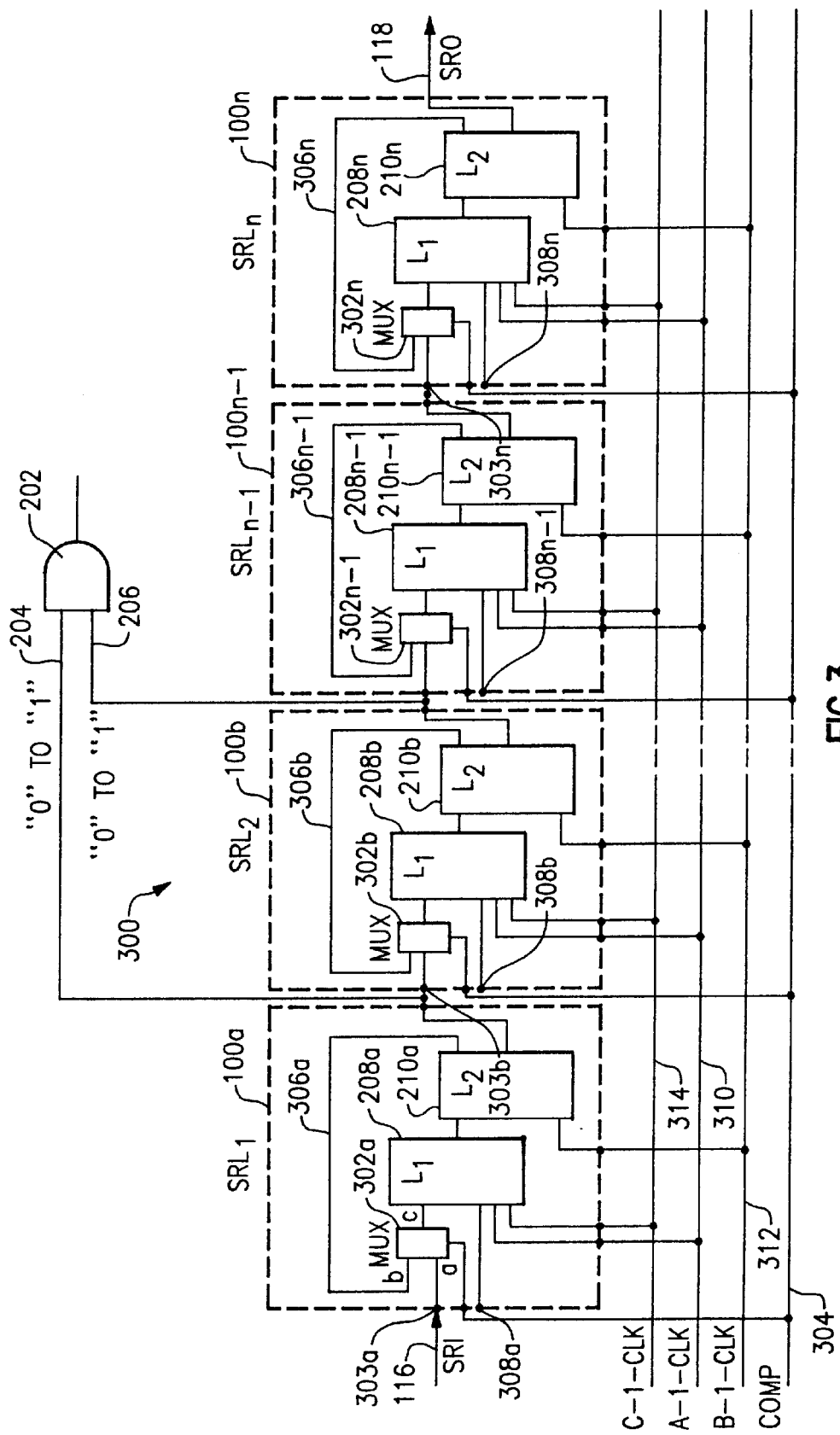
FIG. 3 is a schematic of an LSSD chain incorporating on the embodiment of the present invention.

FIG. 3 shows a LSSD scan chain circuit 300 in accordance with the present invention. Like the prior art LSSD scan chain circuit 104, this chain circuit comprises a plurality of shift register latches (SRLs) 100 (herein designated as $SRL_1, SRL_2, \ldots, SRL_{N-1}, SRL_N$) in which each SRL 100 includes a master latch 208 and a slave latch 210. The SRLs of the present scan chain differ from those in the scan chain 104 in FIG. 2 in that each of the SRLs 100 contains a multiplexer or MUX 302 at the shift register scan line inputs 303. The state of the complement line 304 controls the input to each master latch 208. With the complement line dormant, serial data on the scan line is inputted to master latches 208 through the MUXs. Therefore, with the complement line 304 down, data provided to the SRI terminal 116 can be transferred from one SRL to another. As described below, data is clocked into each SRL 100 by applying a clock pulse to master latch 208, and data is clocked out of each SRL 100 by applying a clock pulse to slave latch 210. Data is clocked from slave latch 210 to a succeeding master latch 208. In addition to the scan line input, SRLs have input 308 for receipt of data from logic circuits in combinatorial logic block 106, 108 or 110 and outputs to combinational logic circuits.

The operation of the LSSD scan chain 300 is controlled by scan clock signals on the A-clk, B-clk, C-clk and complement lines. With the comp line 304 dormant, serial loading of the master latch 208a from the SRL 116 occurs upon generation of an A-clk pulse on A-clk line 310. The A-clk pulse on A-clk line 310 causes serial input applied to the SRLs 100 to be inputted to each master latch 208. Application of a B-clk on B-clk line 312 causes data to be output from the SRLs via slave latches 210. The continuous, alternating application of A-clk and B-clk clock pulse signals on respective A-clk line 310 and B-clk line 312 sequentially propagates a data signal applied to SRI 116 through scan chain 300 to SRO 118. To effect a parallel load, a $C_1$-clk clock pulse is applied to C-clk line 314. This causes a parallel load of data via parallel data inputs 308 and combinational logic to each master latch 208 of the SRLs 100. Application of a $C_2$-clk clock pulse to B-clk line 310 causes a parallel output of data from each slave latch 210 of SRLs 100 to provide data on respective parallel output data lines POs 114 or to combinational logic.

In typical level sensitive scan design (LSSD) circuit configurations, each SRL 100 can be used as a pseudo-primary input and a pseudo-primary output of each combinational logic block 106, 108 and 110 in addition to the PIs and POs for LSSD circuit 300. This enables the stimulation and observability of the device being tested or diagnosed. A major drawback of this test methodology is encountered when the scan chain does not function properly to access to the internal logic of the chip 102. As pointed out above in connection with FIG. 2, a known problem with the prior art LSSD scan chain 104 is the inability to test certain logic state transitions. One such inability occurs when adjacent latches 210 and 210c feed both inputs 204 and 206 of the AND circuit 202 in order to test for a slow-to-rise fault (0 to 1) of AND gate 202, he input requires a 0 to 1 logic transition on at least one of the inputs 204 and 206 of the AND ate while the other input remains or transitions to the "1" state. As shown by the logic 1 and 0 states of latches 208b and 210b respectively, and the 0 and 1 logic states of the latches 208c and 210c, the necessary 0 to 1 transition can be provided to first input 204. However, the necessary 1 logic state cannot be provided to the second input 206 because slave latch 210c and master latch 208c are directly connected and have the same logic 0 value after the shift. Thus, because of the structure of LSSD scan chain 102 (adjacent latches feeding the same basic logic gate), the required test patterns can never be achieved. This latch adjacency problem can dramatically reduce the delay fault coverage, and further impact the delay fault shipped product quality level (SPQL).

Figure 4:
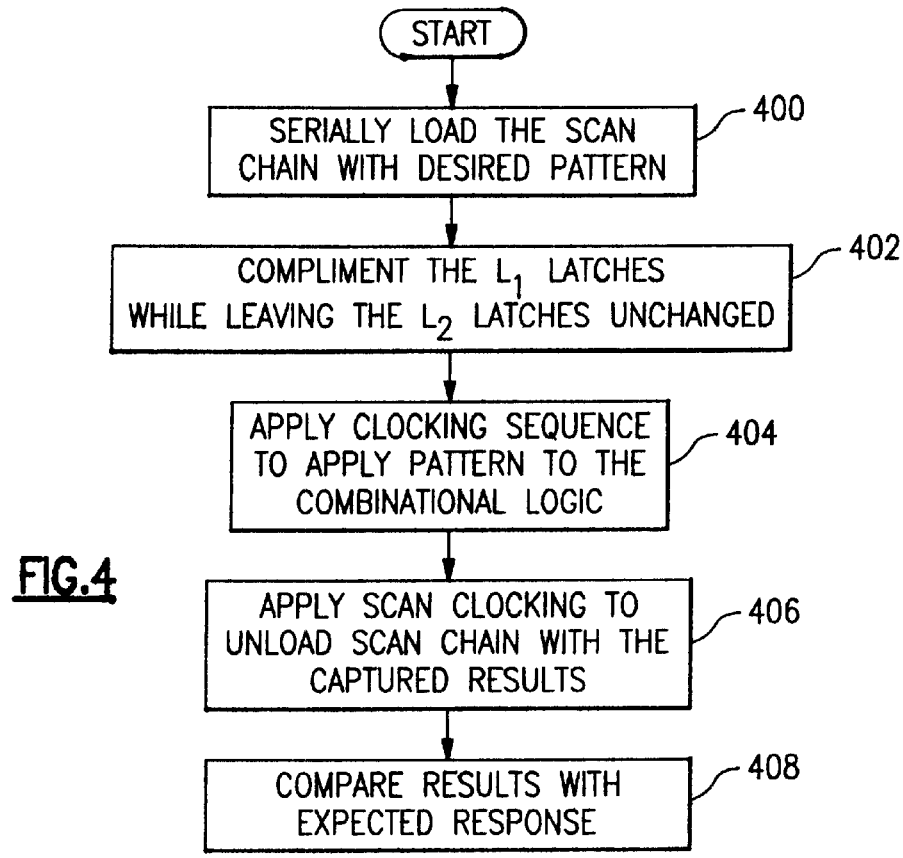
FIG. 4 is a flow diagram of a method operation of the scan chain of FIG. 3 for overcoming the latch adjacency transition restriction.

The latch adjacency problem is overcome in the present LSSD scan chain 300 by the placement of a 2:1 multiplexor (MUX) 302 in each SRL in the LSSD scan chain 300. As shown in FIG. 3, MUX 302a includes an a-input, a b-input and a c-output. In operation, the logic signal present on either the a-input or the b-input can be outputted on c-output to the MUX 302. When either the a input or b input is selected, the other input is not. The switching between the a and b inputs is controlled by complement line 304. Up until now the operation of the LSSD scan chain has been described with the complement line 304 dormant so that the a-input is selected and the output of one SRL is transferred to the next SRL in the LSSD chain so that an input placed on the SRI input 116 can be propagated from one SRL 100 to the next down the chain to the SRO output 118. When the complement line is active, the MUX 302 disconnects the SRLs 100 from one another. Instead of being connected to the true output of the slave latch in the predecessor SRL, the master latch in each SRL is coupled to the complement output of the slave latch in its own SRL. This allows the data stored in any SRL to be changed independently of the data in the slave latch 210 in the predecessor SRL in the LSSD chain. This arrangement makes possible identical transitions at the outputs of adjacent SRLs to overcome the adjacent latch problem As shown in FIG. 4, with the complement line dormant, an all "0" pattern is entered into the LSSD scan chain 300 by applying the "0" pattern to SRI 116 and transferring it down the chain by alternate application of the A-clk and B-clk pulses (step 400). When the LSSD chain is fully loaded so that the L1 and L2 latches in all the SRLs are in the "0" state, the comp line 304 is activated, and an A-clk pulse is applied to the A-clk line without a subsequent application of a B-clk to the B-clk line 312 (step 402). This feeds the complement of L2 output into the L1 latch pulse so that each of the SRL contains a "10" pattern with a "1" bit stored in the L1 latch and a "0" bit stored in the L2 latch 402. With a "10" pattern in each of the SRLs, the pattern can be moved in the LSSD chain by sequential application of A-clks and B-clks to the L1 and L2 latches, respectively 406 (step 404). As shown in FIG. 3, this results in the simultaneous transition of the outputs of the slave latch 210a and 210b from the "0" to the "1" state activating the AND gate 202. A "01" test pattern can be stored in each SRL by initially storing all "1s" in the SRLs and then changing the state of the L1 latch to "0" using the same procedure to complement the data in the L1 latch. After the running of this test, scan checking is applied to unload the captured results (step 406) and the results are checked to see if the desired output pattern has been obtained (step 408).

Figure 5:
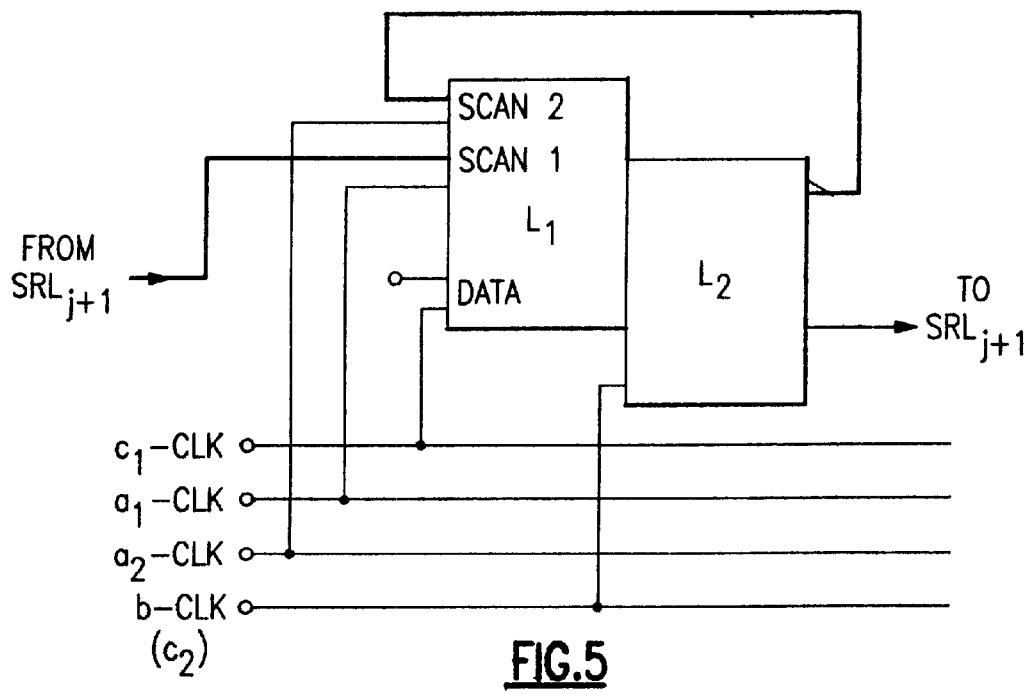
FIGS. 5 and 6 show alternate forms of SRLs to be used in LSSD scan chains of the present invention.
Figure 6:
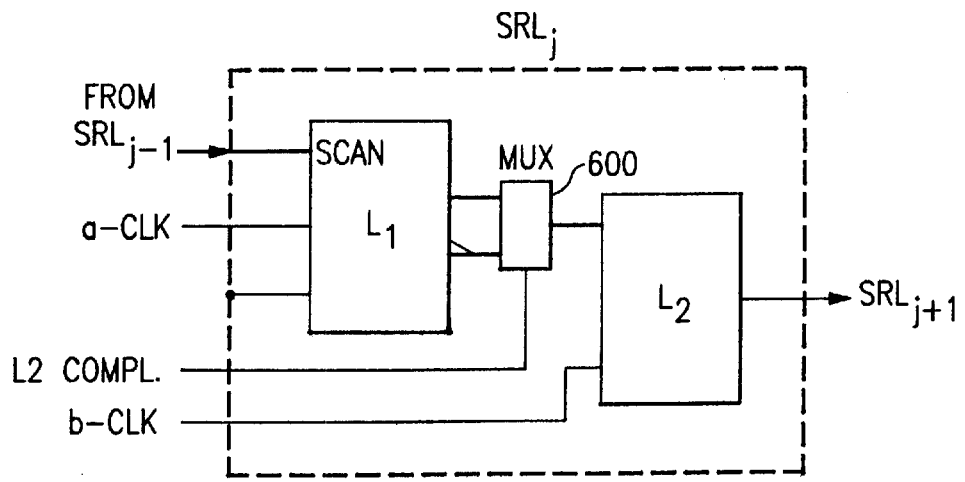

FIGS. 5 and 6 contain alternate SRL configurations to be used in LSSD scan chains of the present invention.

FIG. 5 shows an alternative form for the SRLs in the catch scan chain. Again, the inverse input of the L2 latch in each SRL is fed back to the L1 latch of that SRL. Here the connection back to the latch is by a line connecting the inverse output of the L2 latch to a second of two inputs. Two clocks, an a1 clock for the scan 1 input and a second a2 clock for the scan 2 input, enables selection between the two inputs by operating them under separate clock inputs. The $a_1$-clock enables the scan input to permit shifting test patterns entered at the SRL input down the scan chain while the $a_2$-clock enables the complementing of the L1 data. Otherwise, the circuit operates the same as that set forth with respect to FIGS. 3 and 4.

Like the embodiment in FIG. 5, the SRLs in FIG. 6 employ a MUX to switch between the scanning in and complement functions. However in FIG. 6, the MUX 600 is located between the L1 and L2 latches of the SRLs, and selection is made between the true and complement outputs of the L1 latch by selecting or non-selecting of the L2 line. The operation differs from that previously described in connection with FIG. 4, in that it is the data in the L2 latch that is complemented in step 402 instead of that of the L1 latch. This is done by activating the L2 comp line and providing a B-clk pulse on the B-clk line while retaining the A-clk line dormant. A 0 to 1 transition can therefore be obtained at the outputs of both SRLs 100a and 100b in step 404 by first scanning in all 1's or 0s with the a-clk and b-clk while the L2 comp line is dormant and then activating the L2 comp and b-clk while retaining the a-clk dormant to complement the data in the L2 latch.

Figure 7:
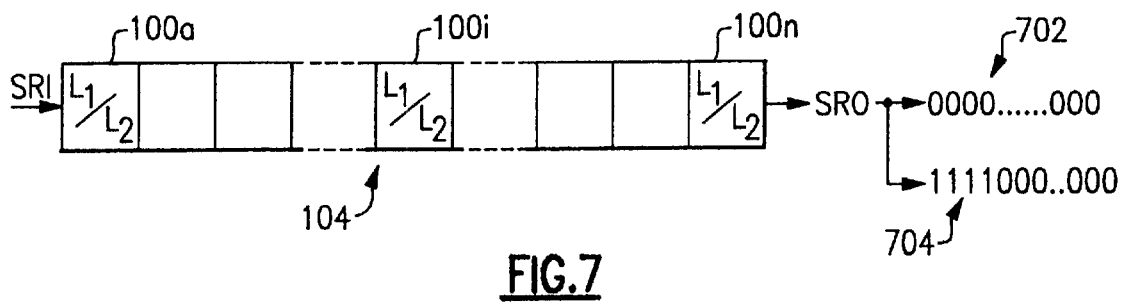
FIG. 7 is a schematic diagram illustrating the SRL scan chain stuck-at fault problem.

As pointed out previously, a major drawback of LSSD methodology is encountered when the scan chain does not function properly and access to the internal logic of the device is greatly reduced. This is often the case early in a technology or product introduction cycle when yields are relatively low. A stuck-at fault condition on scan chain 14 is usually readily apparent. For instance as shown in FIG. 7 in the case of a stuck-at logic 0 fault in SRL 100i, a stream of "0s" logic will come out of the scan chain 14 on SRO 118 after a certain number of clock cycles, no matter if the serial input to SRL 116 is a logic 0 or 1. Therefore, it can be determined that there is a stuck-at 0 fault in the scan chain 14, but the exact location of SRL 100i with the fault condition cannot be located or even isolated.

Figure 8:
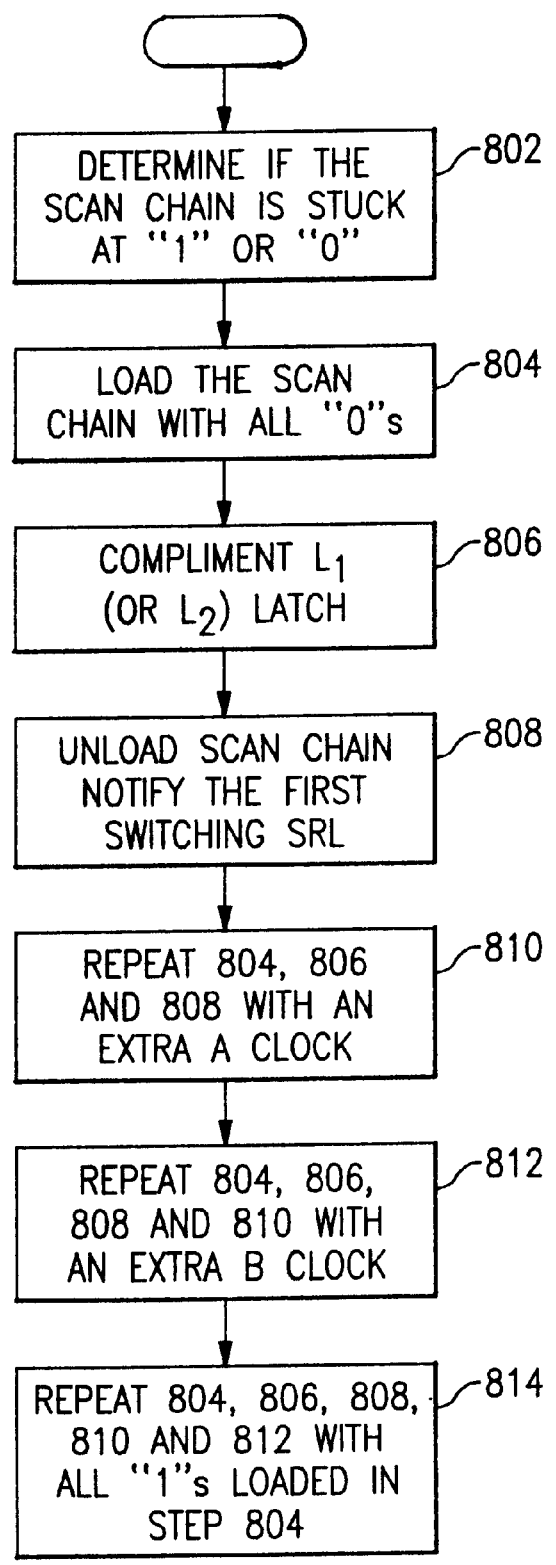
FIG. 8 is a flow diagram of a method of diagnosing of a scan chain of FIG. 3 with a stuck fault condition utilizing the proposed concept.

The proposed SRL complementing approach can greatly simplify the diagnosis of stuck-at fault scan chains by localizing the problem to a specific L1 or L2 in the scan chain. As shown in FIG. 7, with this new scan structure that allows complementing of the L1 or L2 latch, a single DC stuck-at fault SRL 100i can be identified. In the case of a latch 100i stuck-at "0", if all latches are loaded with "1s" by complementing the L1 or L2 latch, the serial reading out of the inputted data will result in a data string 704 with an initial series of "1s" followed by all "0s". The transition from "1s" to "0s" marks the location of the following SRL $100_2$ from the serial output SRO of the scan chain 104. See FIG. 8 for the following test sequence and diagnostic procedure:

1. Determine if the scan chain is stuck-at-0 or stuck-at-1 (step 802).
2. Load the scan chain with all "0"s (step 804).
3. Complement L1 (or L2) latch (step 806).
4. Unload scan chain noting the 1 st switching SRL (step 808).
5. Repeat steps 2 to 4, but use skewed load in step 2 (i.e. extra a-clock) (step 810).
6. Repeat steps 2 to 5, but use skewed unload in step 4 (i.e. extra b-clock) (step 812).
7. Repeat steps 2 to 6, but load all "1" instead of all "0" in step 2 (step 814).

Not all of the above steps need to be applied to diagnose the failing latch. Depending on step 1 and the type of failing condition, the diagnostic procedure can be further simplified. Of course, if the scan clocks or the complementing function are not functional, then the above procedure does not fully apply. However, the above diagnostic technique can be extended by using the complementing function in conjunction with lateral insertion diagnostic methods to enhance localization of multiple scan defects, clock defects and complex un-modeled faults.

The proposed approach is superior to other methods because it provides a unique integral solution to the latch adjacency and to the stuck-at scan chain problem with the following advantages and benefits:

a. High effectiveness AC test with no structural limitations.
b. On-the-fly tester based scan diagnostic call-out.
c. Compatible with existing structural LBIST base (STUMPS).
d. Compatible with LSSD and other scan designs.
e. Compatible to present scan design and test methodologies.
f Does not require additional I/Os besides an A2-clock or complement enable.
g. Implementation is relatively simple and requires low circuit overhead when integrated within the SRL macro.
h. Minimal system performance impact. Changes to the scan path only, not to system critical paths.

Figure 9:
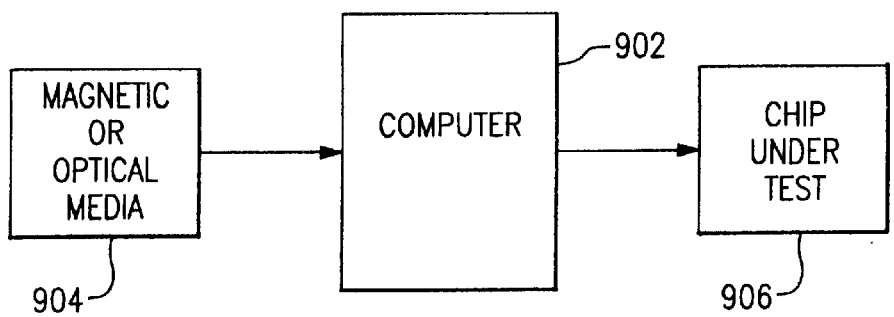
FIG. 9 is a block diagram of a computer system for use with the present invention.

The additional cost of these benefits are minimal. It only requires an additional scan clock (A2-clock) or complement enable and the L1 (or L2) latch requires an additional scan-in data port multiplexer. As shown in FIG. 9, the testing algorithms can be provided to a test computer 902 on magnetic or optical media 904 to test the chip under test 906.

The foregoing discussion discloses and describes exemplary embodiments of the present invention. One skilled in the art will readily recognize from such discussion, and from the accompanying drawings and claims, that various changes, modifications and variations can be made therein. For instance, the invention has been described in terms of particular scan chain and shift register configurations. Of course, it is applicable to other such configurations. Therefore, it should be understood that the present invention is not limited to those embodiments but all embodiments within the spirit and scope of the invention as defined in the following claims.

What is claimed is:

1. A scan chain latch circuit including a plurality of shift register latch sets each set comprising:
   a master latch;
   a slave latch; and
   no more than one MUX circuit, which MUX circuit receives a complementary signal to switch the latch set between two operating states, a first operating state which transmits data from a preceding latch set and a second operating state in which the data is transferred between the latches in the set so that the data in one of the master latch or slave latch is changed without changing the data of the other latch and independently of the data in the preceding shift register latch set in the scan chain.

2. The circuit of claim 1, wherein said MUX circuit is positioned at the input of the master latch for switching between the output of the previous shift register latch in the first operating state to the complement of the data in the slave latch in the second operating state.

3. The circuit of claim 1, wherein the MUX circuit is located in a path feeding outputs of the master latch to an input of the slave latch for switching between the true output of the master latch to the complement output of the master latch.

4. A computer program on a magnetic media usable with a computer for testing combinational and sequential logic circuits with memory units in individual logic units coupled together to form shift register latches, for storing two data bits, arranged in a shift register scan path for testing the logic circuits, the computer program comprising:
   computer code for shifting data through the scan path to load the shift register latches with a first data pattern;
   computer code for complementing one of the two data bits in each of the shift register latches independently of the data in the preceding shift register latch of the chain while leaving the other data bit in the shift register latch unchanged;
   computer code for determining a stuck-at fault condition and the stuck-at fault state in the shift register scan chain; and
   computer code for using said complementing of data code of the one of the two data bits in determining the position of the stuck-at fault bit in the scan chain register.

5. A method for testing a logic circuit containing combinational and sequential logic comprising the steps of:
   coupling memory units in the logic circuit to form a shift register scan path of shift register latches where each of the latches store two bits of data;
   providing a latch set mechanism in each of the shift register latches for complementing one of the data bits while leaving the other data bit in the latch unchanged;
   using the latch set mechanism in the shift register latches to complement one of the data bits in each of the shift register latches while leaving the other data bit in the latch unchanged to provide a modified test pattern;
   keeping data in the shift register latches isolated from one another during the complementation step;
   shifting the modified test pattern through the shift register scan path to test circuits with inputs from adjacent shift register latches;
   determining if a stuck-at fault shift register latch is stuck-at either a binary "1" or a binary "0"; and
   using the latch set mechanism to complement data in the shift register latches to locate the position of the stuck-at fault shift register latch in the scan chain.

6. The method of claim 5 wherein the shift register latches each comprise a master and a slave latch with one data bit stored in each latch.

7. The method of claim 6 including the step of using data in slave latches to complement the data in master latches.

8. The method of claim 6 including the step of using data in master latches to complement the data in slave latches.

9. A method for testing a logic circuit containing combinational and sequential logic comprising the steps of:

coupling memory units in the logic circuit to form a shift register scan path of shift register latches where each of the latches store two bits of data;

providing a latch set mechanism in each of the shift register latches for complementing one of the data bits while leaving the other data bit in the latch unchanged;

shifting data serially through the scan path to load the shift register latches with a test pattern containing all "0"s or all "1"s; and using the latch set mechanism in the shift register latches to complement one of the data bits in each of the shift register latches while leaving the other data bit in the latch unchanged to store a modified test pattern of a logical "1" and "0" in each latch set to provide a 0 to 1 transition to two inputs of a logic circuit connected to the outputs of two adjacent latch sets.

10. The method of claim 9 including the step of keeping data in the shift register latches isolated from one another during the complementation step.

11. The method of claim 10 including the step of shifting the modified test pattern through the shift register scan path to test circuits with inputs from adjacent shift register latches.

12. A method for testing a logic circuit containing combinational and sequential logic comprising the steps of:

coupling memory units in the logic circuit to form a shift register scan path of shift register latches where each of the latches store two bits of data one bit in an input a master latch and one bit in a slave latch output;

providing a latch set mechanism in each of the shift register latches for complementing one of the data bits in the latch while leaving the other data bit in the latch unchanged;

determining if a stuck-at fault shift register latch is stuck-at either a binary "1" or a binary "0"; and using the latch set mechanism to complement data in the shift register latches to locate the position of the stuck-at fault shift register latch in the scan chain.

13. The method of claim 12 including the step of using data in slave latches to complement the data in master latches.

14. The method of claim 12 including the step of using data in master latches to complement the data in slave latches.

15. The method of claim 12 including the steps of:

a. Loading the scan chain with one of all "0"s or "1"s;

b. Complementing the master or slave latch, c. Unload scan chain noting the 1 st switching latch; and d. Repeat steps a to c, but load he other of all "0"s or "1"s.

\* \* \* \* \*